(12) United States Patent
Torres et al.

(10) Patent No.: US 8,470,685 B2
(45) Date of Patent: Jun. 25, 2013

(54) INTEGRATION OF SELF-ALIGNED TRENCHES IN-BETWEEN METAL LINES

(75) Inventors: Joaquin Torres, St. Martin le Vinoux (FR); Laurent-Georges Gosset, Toulouse (FR)

(73) Assignees: STMicroelectronics (Crolles 2) SAS, Crolles (FR); Koninklijke Philips Electronics N.V., Eindhoven (NL)

( * ) Notice: Subject to any disclaimer, the term of this patent is extended or adjusted under 35 U.S.C. 154(b) by 537 days.

(21) Appl. No.: 12/161,456

(22) PCT Filed: Jan. 11, 2007

(86) PCT No.: PCT/IB2007/000162
§ 371 (c)(1),
(2), (4) Date: Dec. 8, 2009

(87) PCT Pub. No.: WO2007/083237
PCT Pub. Date: Jul. 26, 2007

(65) Prior Publication Data
US 2010/0090346 A1 Apr. 15, 2010

(30) Foreign Application Priority Data

Jan. 18, 2006 (EP) .................................... 06290125

(51) Int. Cl.
*H01L 21/76* (2006.01)
(52) U.S. Cl.
USPC ........... 438/421; 438/238; 438/597; 257/288; 257/774; 257/273; 257/296; 257/758
(58) Field of Classification Search
USPC .................. 438/421, 238, 597; 257/288, 774, 257/273, 296, 510, 757, 272, 522
See application file for complete search history.

(56) References Cited

U.S. PATENT DOCUMENTS

| | | | |
|---|---|---|---|
| 6,035,530 A | 3/2000 | Hong | |
| 6,261,950 B1* | 7/2001 | Tobben et al. | 438/641 |
| 6,303,464 B1* | 10/2001 | Gaw et al. | 438/422 |
| 6,413,852 B1 | 7/2002 | Grill et al. | |
| 6,607,967 B1* | 8/2003 | Pallinti et al. | 438/411 |
| 6,677,190 B1* | 1/2004 | Houston | 438/149 |
| 6,838,355 B1 | 1/2005 | Stamper et al. | |
| 6,872,633 B2* | 3/2005 | Huang et al. | 438/435 |
| 7,138,329 B2* | 11/2006 | Lur et al. | 438/619 |
| 7,400,024 B2* | 7/2008 | Kunnen | 257/511 |
| 7,504,704 B2* | 3/2009 | Currie et al. | 257/510 |
| 2003/0022483 A1* | 1/2003 | Shroff et al. | 438/637 |

(Continued)

*Primary Examiner* — Fernando L Toledo
*Assistant Examiner* — Mohammed Shamsuzzaman
(74) *Attorney, Agent, or Firm* — Fleit Gibbons Gutman Bongini & Bianco P.L.

(57) ABSTRACT

The present invention provides an improved method of forming air cavities to overcome IC via-misalignment issues. The method of forming air cavity trenches in-between metal lines of an integrated circuit includes the steps of partially removing (42) an intertrack dielectric deposited on an interconnect structure surface to control the height between the top surface of a metal line of the interconnect surface and the surface of the intertrack dielectric; depositing (44) a dielectric liner on the interconnect surface; removing (46) at least part of the dielectric liner on the interconnect surface; successively repeating (48) the deposition of the dielectric liner and the removal of the dielectric liner on the interconnect surface in so far as the interconnect surface is sufficiently protected by a remaining dielectric liner for forming of the plurality of air cavity trenches; and forming (50) at least one air cavity trench in-between the metal lines by etching the intertrack dielectric material.

11 Claims, 9 Drawing Sheets

U.S. PATENT DOCUMENTS

| | | | |
|---|---|---|---|
| 2003/0224580 A1* | 12/2003 | Huang et al. | 438/435 |
| 2004/0152271 A1* | 8/2004 | Wu et al. | 438/270 |
| 2006/0003521 A1* | 1/2006 | Fukunaga et al. | 438/232 |
| 2006/0258077 A1* | 11/2006 | Kunnen | 438/202 |
| 2009/0294898 A1* | 12/2009 | Feustel et al. | 257/522 |
| 2010/0052094 A1* | 3/2010 | Carter et al. | 257/510 |
| 2012/0013022 A1* | 1/2012 | Sabuncuoglu Tezcan et al. | 257/774 |

* cited by examiner

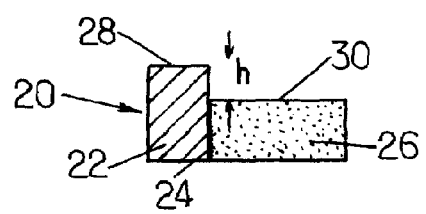
FIG.4.
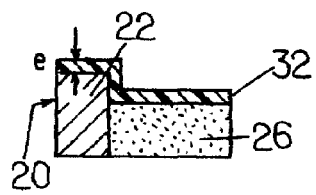
FIG.5A1.
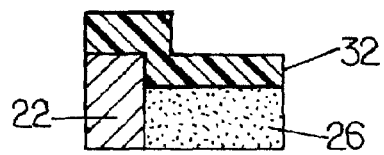
FIG.5B1.
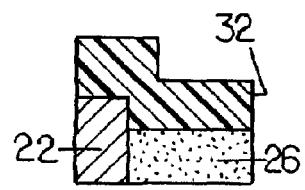
FIG.5C1.
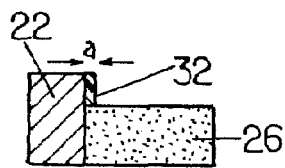
FIG.5A2.
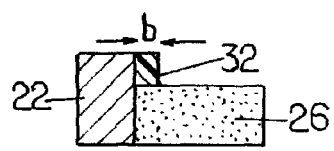
FIG.5B2.
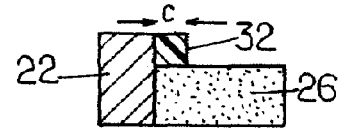
FIG.5C2.

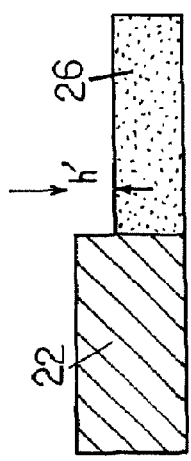
FIG.6A1.
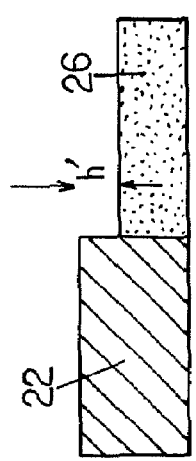
FIG.6A2.
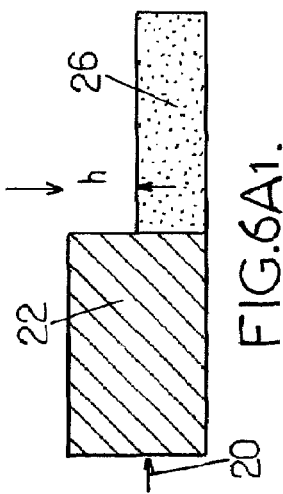
FIG.6A3.
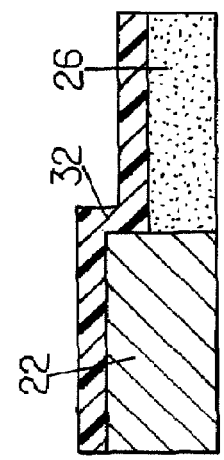
FIG.6B1.
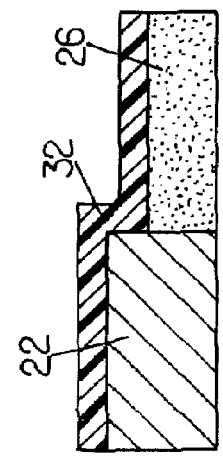
FIG.6B2.
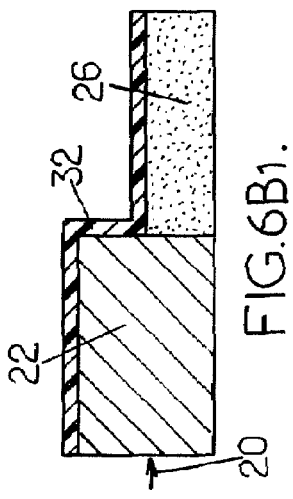
FIG.6B3.
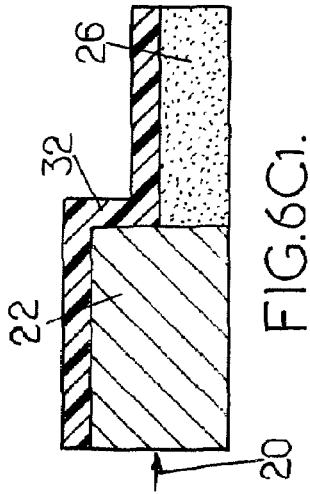
FIG.6C1.
FIG.6C2.
FIG.6C3.

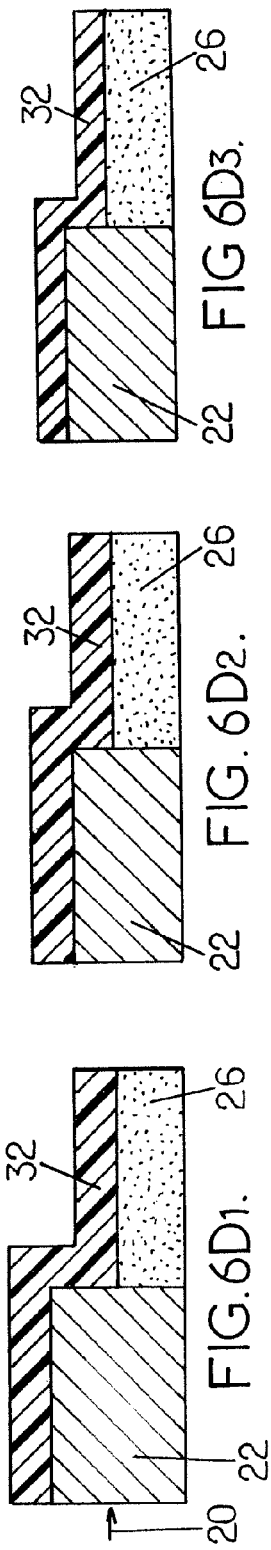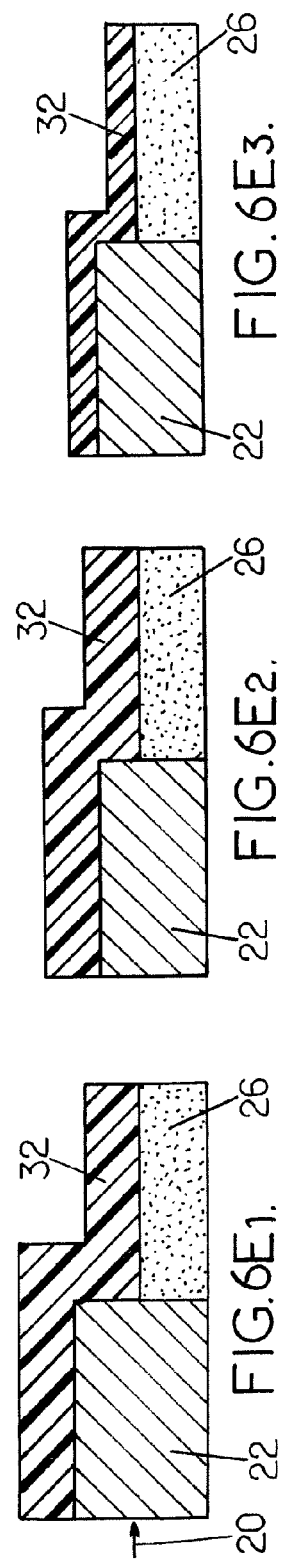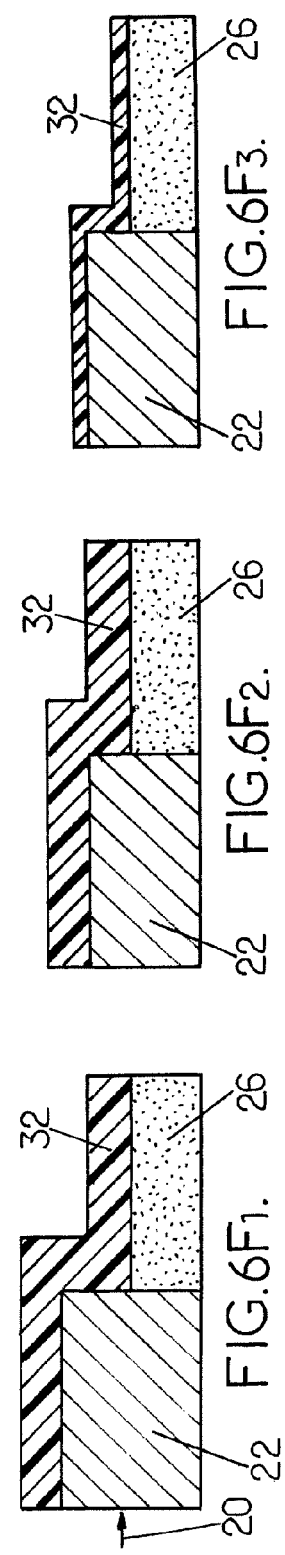

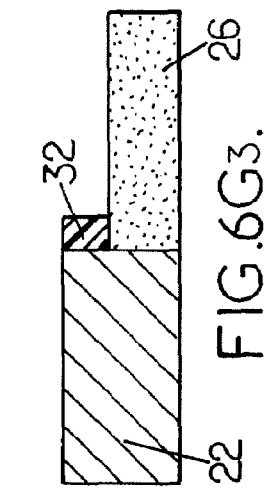
FIG.6G1.
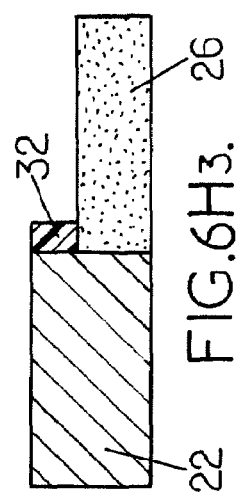
FIG.6H1.
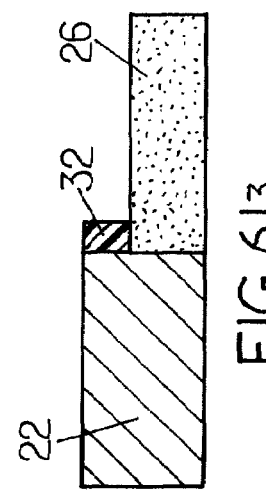
FIG.6I1.
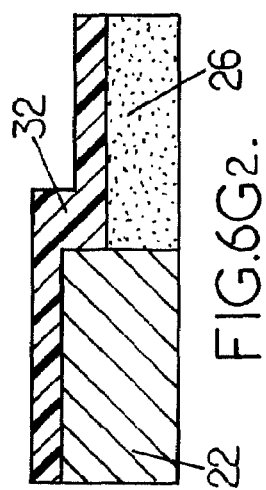
FIG.6G2.
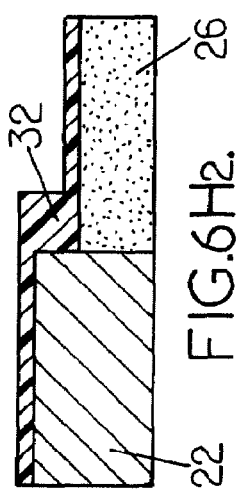
FIG.6H2.
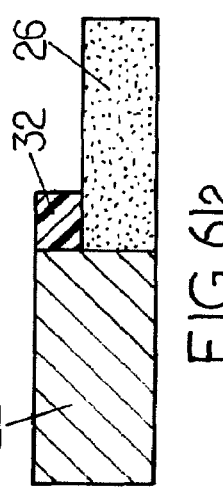
FIG.6I2.
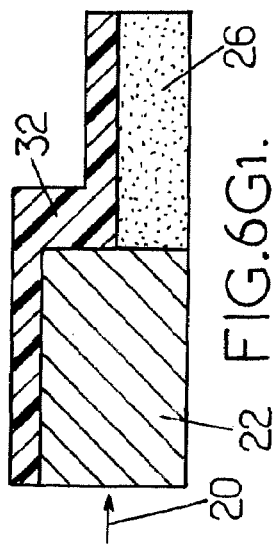
FIG.6G3.
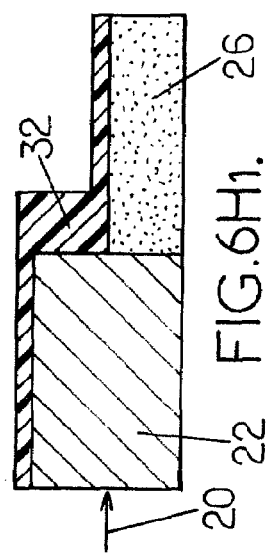
FIG.6H3.
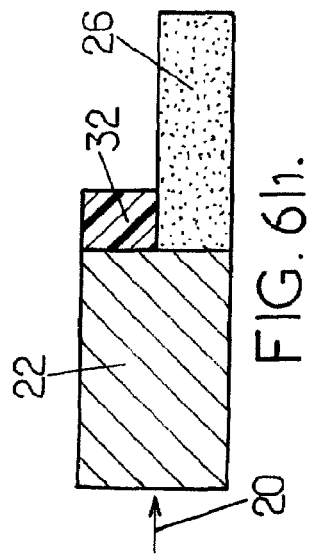
FIG.6I3.

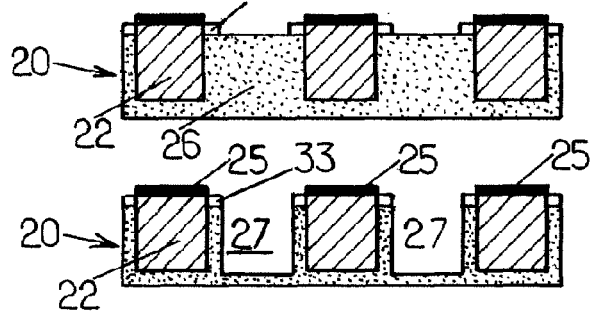
FIG.9G1.
FIG.9H1.
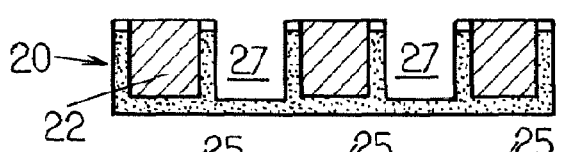 FIG.9G2.
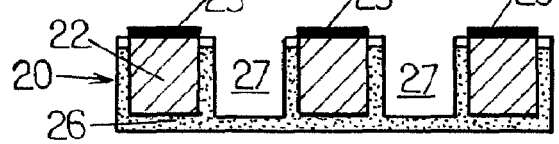 FIG.9H2.

INTEGRATION OF SELF-ALIGNED TRENCHES IN-BETWEEN METAL LINES

FIELD OF THE INVENTION

The present invention relates to fabrication of integrated circuits, and in particular, the invention relates to the integration of self-aligned trenches in-between metal interconnect lines.

BACKGROUND OF THE INVENTION

A semiconductor device such as an IC (integrated circuit) has electronic circuit elements such as transistors, diodes and resistors fabricated integrally on a single body of semiconductor material. The various circuit elements are connected through conductive connectors to form a complete circuit which can contain millions of individual circuit elements. Advances in semiconductor materials and processing techniques have resulted in reducing the overall size of the IC circuit elements while increasing their number on a single body. Additional miniaturization is highly desirable for improved IC performance and cost reduction.

Consequently, the spacing between the metal lines on any given plane of an IC has become smaller and smaller, now extending into the submicrometer range. By reducing the spacing between conductive members in the IC, an increase in capacitive coupling occurs. This increase in capacitive coupling causes greater crosstalk, higher capacitive losses and increased RC time constant.

In order to reduce capacitive coupling, new developments and implementation of low dielectric constant (low-k) materials have been proposed to replace classic dielectric materials that are interposed between the metal lines on a given layer and between layers. Typically, conventional electronic insulators have dielectric constants in the 3.5 to 4.2 range. For example, silicon dioxide ($SiO_2$) has a dielectric constant of 4.2, and advanced polymers have dielectric constants in the 2.5 to 3.0 range. Insulating materials having lower dielectric constants are known, but such materials have been associated with problems such as processing, cost and instability.

Therefore, in back-end-of-line (BEOL) processing, a very important change included the replacement of low-k dielectrics with ultralow-k dielectrics such as air gaps because air gaps have the lowest k value of any material (k value of about 1.0). The lowest possible dielectric constant is 1.0, which is the dielectric constant of a vacuum, and air has a dielectric constant of 1.001. Given this recognition of the low dielectric constant of air, attempts have been made to fabricate semiconductor devices with air gaps between metal leads to reduce the capacitive coupling between the electrically conducting members. The air gap forming techniques that have been used with varying degrees of complexity and limitations.

There are several techniques for forming air gaps or regions in a semiconductor device. Typically, integration schemes are known for forming air gaps using non-conformal CVD (Chemical Vapor Deposition). Notably, as illustrated in FIG. 1, for example, when air cavities are formed prior to the via etching process, if the via-misalignment is too wide, or the via etching is not stopped by a specific material (etching selectivity), prior to the formation of the cavity breakthrough, the cavities remain open (e.g., opening 1 shown in FIG. 1). Consequently, some metal material will be deposited inside the as-opened cavities during the next integration step which can be a serious issue with regards to interconnect reliability.

Further, referring to FIG. 2, to overcome via-misalignment issues during air-gap formation using non-conformal CVD processes, a conventional technique proposes to locally enlarge the line width 2 to guide the via landing. However, this solution is detrimental to the density and performance of the IC devices.

Moreover, to avoid via-misalignment issues, for instance, the use of an additional lithographic step has been proposed. This particular solution as illustrated in FIG. 3, however, leads to some dielectric liner 3 remaining on top of the interconnect stack at the metal level, thus reducing interconnect performance, although via misalignment can be lessened using this method. Another concern is that the trenches must be narrower than metal spice and the metal-to-metal misalignment must be taken into account. This problem makes this approach very expensive and complex as the lithographic step must be repeated at the creation of each metal level.

Therefore, in view of these concerns, there is a continuing need for developing a new and improved method in which integration of self-aligned trenches in-between metal lines can be carried out, which addresses the above mentioned problems. In particular, it is desirable to simultaneously ensure a larger via-landing to overcome via-misalignment issues without degrading the intra-metal level coupling capacitance.

SUMMARY OF THE INVENTION

Briefly described, one object of the invention is to provide a method of forming a plurality of air cavity trenches in-between metal lines of an integrated circuit. The method includes partially removing an intertrack dielectric layer deposited on a semiconductor interconnect structure surface to control the height between the top surface of a metal line of the interconnect surface and a surface of the intertrack dielectric layer; depositing a dielectric liner (or spacer) on the interconnect surface using a conformal deposition process; removing at least part of the dielectric liner on the interconnect surface using a directional (i.e. non isotropical) etching process; successively repeating the deposition step of the dielectric liner and the removal step of the dielectric liner on the interconnect surface if necessary and as many times as necessary to achieve a desired width of the remaining dielectric liner on the interconnect structure surface; and forming at least one air cavity trench in-between the metal lines by selectively etching the intertrack dielectric material using the remaining dielectric liner on the interconnect structure surface as an etching mask.

Specifically, other features of the method are further recited in the dependent claims. In embodiments of the invention, one or more of the following features may also be included.

Depositing the dielectric liner can be performed by using chemical vapor deposition (CVD) or plasma enhanced chemical vapor deposition (PECVD) techniques. Further, removing at least part of the dielectric liner on the interconnect structure surface may include etching the dielectric liner using reactive ion etching (RIE) techniques. Tools for using such techniques are readily available.

In certain embodiments, the method also includes utilizing the remaining dielectric liner on the interconnect structure surface as a land pad for via landing on the metal line during subsequent process of forming vias, thus ensuring larger via landing.

As yet another feature, the metal lines comprise a self-aligned barrier to avoid diffusion of metal in the surrounding material.

As yet another feature, the step of partially removing the intertrack dielectric layer deposited on the interconnect surface to control the a.m. height may be carried out based on the desired width of the air cavity trenches in-between metal lines. Stated otherwise, the amount of dielectric which is removed depends on said desired width.

Additionally, the method may also include controlling a level of the dielectric liner deposited on the interconnect surface prior to the step of removing at least part of the dielectric liner. This step of controlling may also be carried out based on the desired width of the air cavity trench in-between metal lines.

The method can also include utilizing the remaining dielectric liner on the interconnect surface serves as an etch-stop layer for forming vias in the IC.

According to another aspect of the invention, a semiconductor device includes—a semiconductor substrate, an intertrack dielectric layer formed on the substrate, metal lines formed on the substrate, and at least one air cavity formed between the metal lines, wherein the semiconductor device further comprises a dielectric liner deposited on the semiconductor interconnect structure surface for spacing out the air cavity trench and the metal lines.

Specifically, other features of the semiconductor device are further recited in the dependent claims, and in embodiments of the invention, one or more of the following features may also be included. The remaining dielectric liner on the interconnect surface may serve as a land pad for via landing on the conductive material. As another feature, the metal lines may be encapsulated from the intertrack dielectric material by a diffusion barrier layer. As still another feature, the semiconductor device metal lines may comprise a self-aligned barrier.

Embodiments may have one or more of the following advantages.

The method optimizes the fabrication of air cavities using a self-aligned process that allows good coupling capacitance performances, such as air cavity width control and via-misalignment. Further, the method also eliminated the expensive and tedious process of having to carry out an additional step of using a dielectric liner with an associated lithographic step Furthermore, the method and device of the present invention allows control of via etching since the remaining dielectric acts as an etch stop layer that is critical considering the yield in high-speed interconnects.

These and other aspects of the invention will become apparent from and elucidated with reference to the embodiments described in the following description, drawings and from the claims.

BRIEF DESCRIPTION OF THE DRAWINGS

FIG. 4 is a diagrammatic cross-sectional view of a semiconductor interconnect structure, showing in particular, the junction area of the metal line with the dielectric;

FIGS. 5A-C are diagrammatic cross-sectional views of a semiconductor interconnect structure, illustrating three different dielectric liner deposition scenarios in accordance with embodiments of the present invention;

FIGS. 6A-I are diagrammatic cross-sectional views of a semiconductor interconnect structure, illustrating steps of a specific example of a method in accordance with embodiments of the present invention;

FIGS. 9A-H are diagrammatic cross-sectional views of a semiconductor interconnect structure, illustrating several steps of an example of a method according to another aspect of the invention.

DESCRIPTION OF THE PREFERRED EMBODIMENTS

Figure 1:
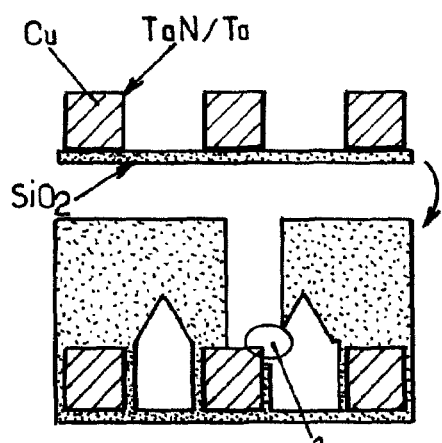
FIG. 1 is a diagrammatic cross-sectional view of a semiconductor interconnect structure, showing a via opening linked to an air cavity.

Referring to FIG. 4, a portion 20 of an interconnect stack where a metal track or metal line (e.g., Cu) 22 of a metallization layer is encapsulated within a diffusion barrier 24 in contact with an intertrack dielectric material 26, is shown. The dielectric material can be, for example, $SiO_2$, and the diffusion layer or barrier 24 can be, for example, purely metal based, a TaN or a bilayer TaN/Ta diffusion barrier (Tantalum Nitride/Tantalum barrier), or a hybrid stack such as SiC/TaNTa (Silicon Carbide/Tantalum Nitride/Tantalum barrier) that is used as a barrier between the copper metal and the silicon and which typically has the same height as the metal line. Alternatively, as shown in the remaining figures for the sake of simplicity, the diffusion barrier 24 may be absent. However, copper can easily diffuse through many materials due to its high mobility in oxides and low-k dielectrics, thus reacting with silicon and if not properly contained, the Cu can "kill" the IC device leading to electrical leakage or IC failure. Thus, barrier layers are preferably deposited on the etched dielectric prior to metal deposition to prevent this type of contamination.

Still referring to FIG. 4, a height "h" represents the difference in height between an upper surface 28 of the Cu metal line 22 and a surface 30 of the dielectric 26. The impact of the initial value of "h" is critical to achieve a good aspect ratio. In other words, for non-conformal CVD techniques, air gap shape depends on the aspect ratio of the trenches. The trenches in-between the metal lines must be tightly controlled in width and height so that the ratio between the height and the width of the trenches is suitable to achieve the generation of well-shaped cavities. This is particularly important as the goal is to achieve air cavities integration as the shape of air cavities (i.e., closure point height, width, volume of the cavity) must be well controlled for any feature size so that any break through into air gaps, potentially followed by metal intrusion (such as previously shown in FIG. 1) is prevented either during upper metal level etching or because of line-via misalignments.

Referring now to FIGS. 5A-C, three different scenarios upon the deposition of a dielectric liner 32 on the portion 20 of the interconnect stack are shown. In FIGS. 5A1, 5B1, and 5C1, a dielectric liner 32 is deposited above the interconnect stack, for example, shown here only as deposited on the portion 20. This can be done using specific properties of a conformal deposition process such as a PECVD dielectric deposition process (Plasma Enhanced Chemical Vapor Deposition) on non-flat surfaces and an associated directional etching process such as the RIE technique (Reactive Ion Etching). PECVD can also be replaced in this process by ALD (Atomic Layer Deposition) tools. The dielectric liner material can be, for example $Si_3N_4$ (Silicon Nitride).

For example, successive deposition and etching of the dielectric liner 32 in an uncapped copper wafer surface (i.e., no self-aligned barrier, SAB, on the metal surface), is shown. In FIGS. 5A1, 5B1, 5C1, each of the deposited dielectric liner 32 has a different thickness "e". In FIG. 5A1, the dielectric liner 32 has the smallest value for "e," and FIG. 5C1 shows the largest value for "e". Once the dielectric liner 32 is etched, for example, using a chemical etching (e.g., RIE) at the IMD level (Inter Metal Dielectric), a controlled removal of a given thickness of the dielectric liner 32 is performed. The results are shown in FIGS. 5A2, 5B2, 5C2. The values of "a," "b," and "c" represent the width of the dielectric liner 32 left behind after the chemical etching process.

In particular, "a" is smaller than "b" which is smaller than "c" (i.e., "a"<"b"<"c"). In fact, the initial value for "h" actually determines the value of the width of the dielectric liner 32 ("a," "b," and "c") after the chemical etching and, thus all three values of "a," "b," and "c" depend on the initial value of "h."

This is further illustrated in closer detail and in sequential steps in FIGS. 6A-I. In FIG. 6A, the portion 20 of the interconnect stack is shown in an uncapped metal surface, as previously with no SAB, where FIG. 6A1 has a value "h," which is larger than the h' (h prime) value of FIGS. 6A2 and 6A3. Sequentially shown, in FIGS. 6B1-3 and 6C1-3, a dielectric liner 32 is deposited, by conventional means which were described previously above. In FIGS. 6B1-3, a first layer of dielectric 32 is deposited and then in FIGS. 6C1-3, a second layer is deposited, making the dielectric layer 32 thicker and wider.

It should be noted that to simultaneously lower the impact of the dielectric deposition on the dielectric constant k and increase the alignment of the via landing, it is possible to lower "h" and repeat the deposition and etching steps, as is shown in the sequence steps of FIGS. 6A-6I.

Figure 2:
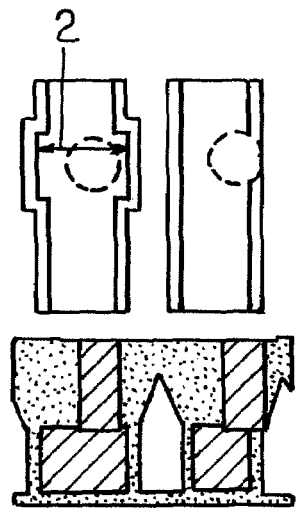
FIG. 2 is a diagrammatic cross-sectional view of a semiconductor interconnect structure having an enlarged metal line width.
Figure 3:
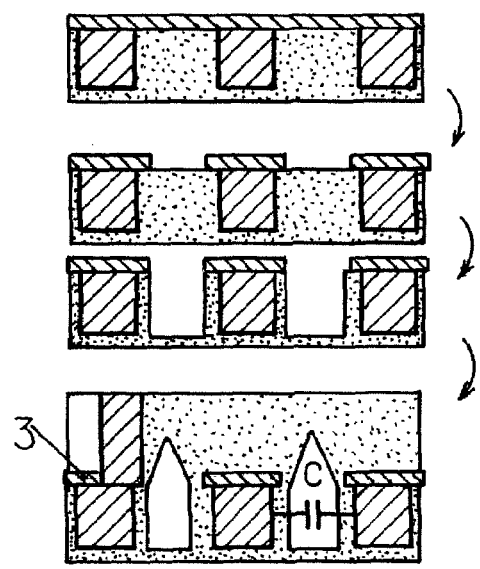
FIG. 3 is a diagrammatic cross-sectional view of a semiconductor interconnect structure where additional lithographic steps are carried out.

Thereafter, in FIGS. 6D1, 6D2, 6E1 and 6E2, for example, the deposition of the dielectrict liner 32 on the interconnect stacks continues to be repeated, except in FIGS. 6D3 and 6E3, where the interconnect stack portion 20 remains with the same level of dielectric liner 32 as deposited in FIG. 6C3. In other words, as can be seen in FIGS. 6E1-3, the width and height of the dielectric liner 32 is different in each of the interconnect structures.

Subsequently, from FIGS. 6F1-3 through FIGS. 6I1-3, the etching process begins to remove the dielectric liner 32, sequentially showing the final three different widths of the dielectric liner 32 for all three interconnect stacks, as shown in FIG. 6I1-3. Thus, as mentioned previously, the initial "h" value (difference in height between the upper surface 28 of the metal line 22 and the surface 30 of the dielectric 26) as well as the number of successive deposition/etch steps affect the topography of the final metal line surface.

In a modified approach, the coating itself of the metal lines using a self-aligned barrier (SAB) deposited using an electroless technique can also be used directly to achieve a controlled typography at the wafer surface between the lines and the dielectric from the IMD. That is, in order to achieve integration and precisely control air gap morphology, introducing a SAB on the metal surface (copper surface, in this example) deposited using an electroless process can be performed. Additionally, the SAB can be achieved using an electroless technique, CVD, or copper surface modification.

This would generate a "mushroom" shape in the metal layer to overcome via-misalignment concerns because the cap formed on the metal layer would be larger and wider than the metal line, with some dielectric remaining on the sidewalls of the trenches after the etching process. This "cap" would act as a potential via landing pad.

Figure 7A:
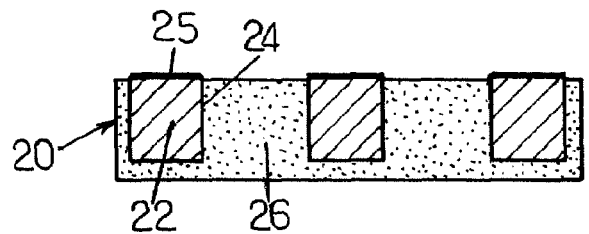
FIGS. 7A-G are diagrammatic cross-sectional views of a semiconductor interconnect structure, illustrating several steps of a method of an example in accordance with embodiments of the present invention.
Figure 7B:
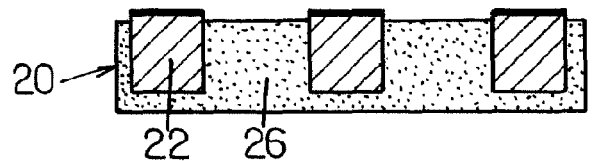
Figure 7C:
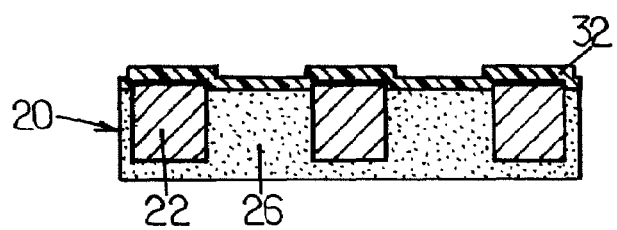
Figure 7D:
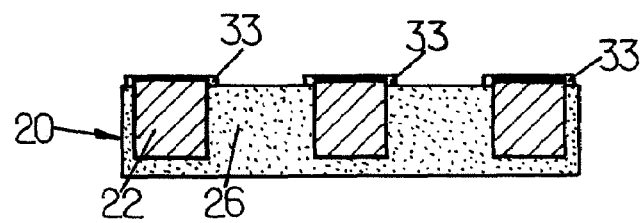
Figure 7E:
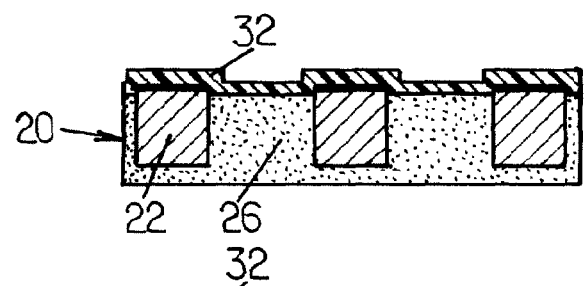
Figure 7F:
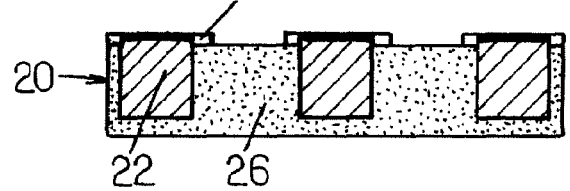
Figure 7G:
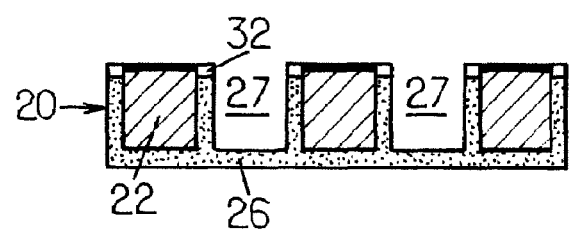

Referring now in detail to FIGS. 7A-G, various steps of a method of producing a semiconductor interconnect structure according to one aspect of the invention are illustrated. In this exemplary integration scheme, a particular interconnect topology is generated using a partial dielectric etch. Thus, the portion 20 of the semiconductor interconnect structure also has the metal layer 22, encapsulated by the diffusion barrier 24 and capped by a self-aligned barrier (SAB) 25, which can be optional (FIG. 7A). Then, in the next step, a partial removal of the dielectric 26 can be performed (FIG. 7B). Next, the dielectric liner 32 is deposited on the modified surface of the interconnect stack using a conformal deposition process such as PECVD or ALD (FIG. 7C) and then a directional etching process such as RIE takes place (FIG. 7D). As a consequence, some dielectrics of the liner 32 remain on edges 33 of the copper lines. Optionally, a second subsequent deposition and etching process can be repeated until the width of the dielectric liner is so that air gap trenches formation can be carried out (FIGS. 7E-F) using the remaining dielectric from the liner 32 as an etching mask for etching the dielectric 25. This results from high selectivity of known processes for etching $SiO_2$ against $Si_3N_4$. Therefore, these sequential method steps result in the formation of air cavities formed in self-aligned trenches 27 in-between the metal lines. The remaining dielectric from the liner 32 can later be used as a land pad for an aligned via landing, thus preventing metal intrusion within the air gaps.

Figure 8A:
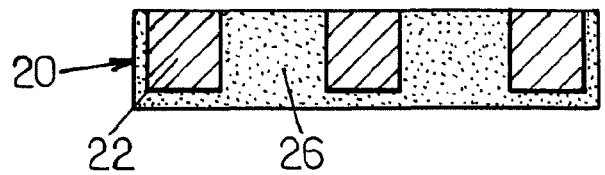
FIGS. 8A-G are diagrammatic cross-sectional views of a semiconductor interconnect structure, illustrating several steps of another specific example of a method according to embodiments of invention.
Figure 8B:
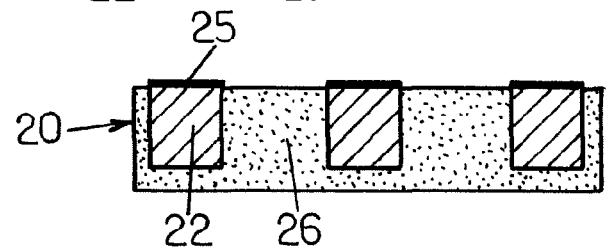
Figure 8C:
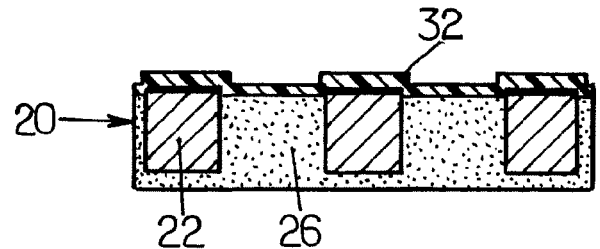
Figure 8D:
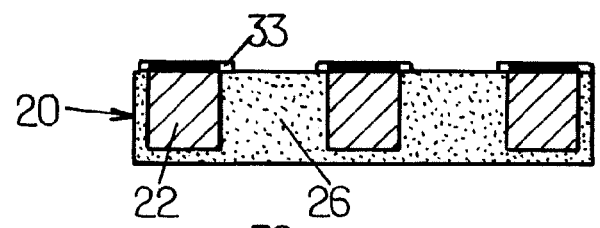
Figure 8E:
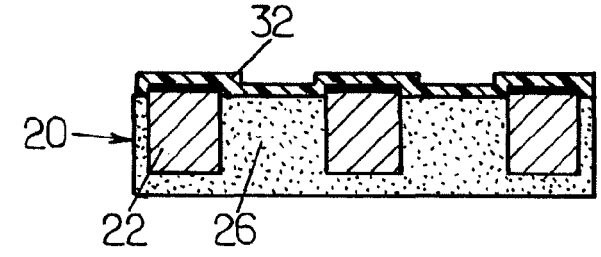
Figure 8F:
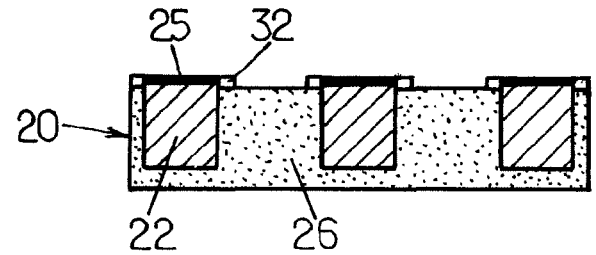
Figure 8G:
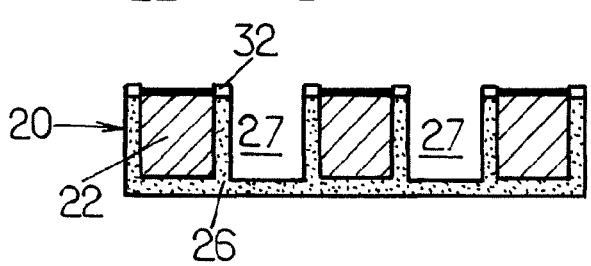

Referring to yet another integration scheme, in FIGS. 8A-G, a desired interconnect topology is generated with a SAB on the metal layer. First, the copper metal lines are shown without (FIG. 8A) and with the SAB cap (FIG. 8B). Then, in the next step, the dielectric liner 32 is deposited (FIG. 8C) and etched (FIG. 8D). Again, as previously mentioned, the steps of dielectric liner deposition and etching can be repeated (FIGS. 8E-F) as desired. Then, the resulting air cavities are formed and the trenches 27 are shown as in FIG. 8G.

Figure 9A:
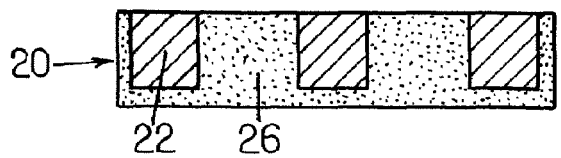
Figure 9B:
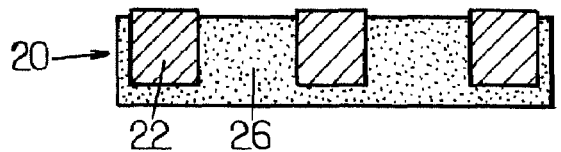
Figure 9C:
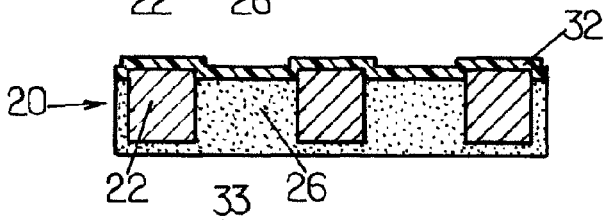
Figure 9D:
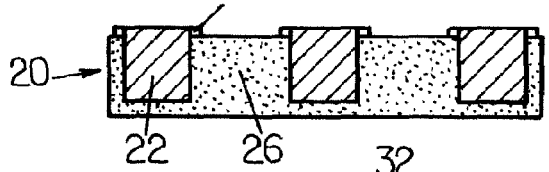
Figure 9E:
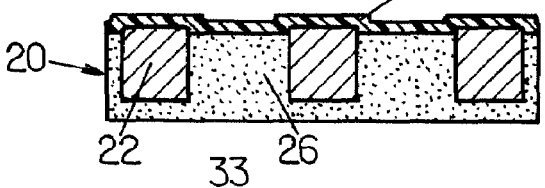
Figure 9F:
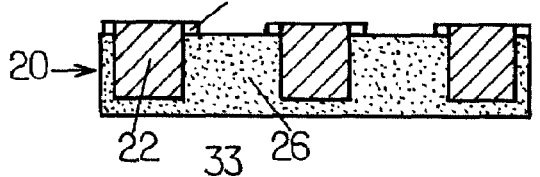

Referring now to FIGS. 9A-H, another integration scheme is shown, modified from the method steps of FIGS. 8A-G, with no copper metal SAB present. First, the copper metal is shown without any SAB on the metal layer (FIG. 9A). A partial dielectric removal is performed (FIG. 9B). Then, in the next step, the liner dielectric deposition step is carried out (FIG. 9C) followed by the liner etching step (FIG. 9D). Again, optional repetition of the dielectric liner deposition and etching steps can be performed (FIGS. 9E-F). Thereafter, the SAB 25 coating can be formed on the copper metal surface (FIG. 9G1), followed by the formation of the air gaps and the trenches 27 (FIG. 9H1). Alternatively, these latter two steps may be switched in order by forming the air gaps and the trenches 27 first (FIG. 9G2), followed by forming the SAB 25 coating on the copper metal surface (FIG. 9H2). In this case, the SAB 25 can be formed using an electroless technique or CVD or copper surface modification. Generally, achieving the SAB 25 above the Cu metal line that increases the line height, both electroless and CVD techniques may be used.

Figure 10:
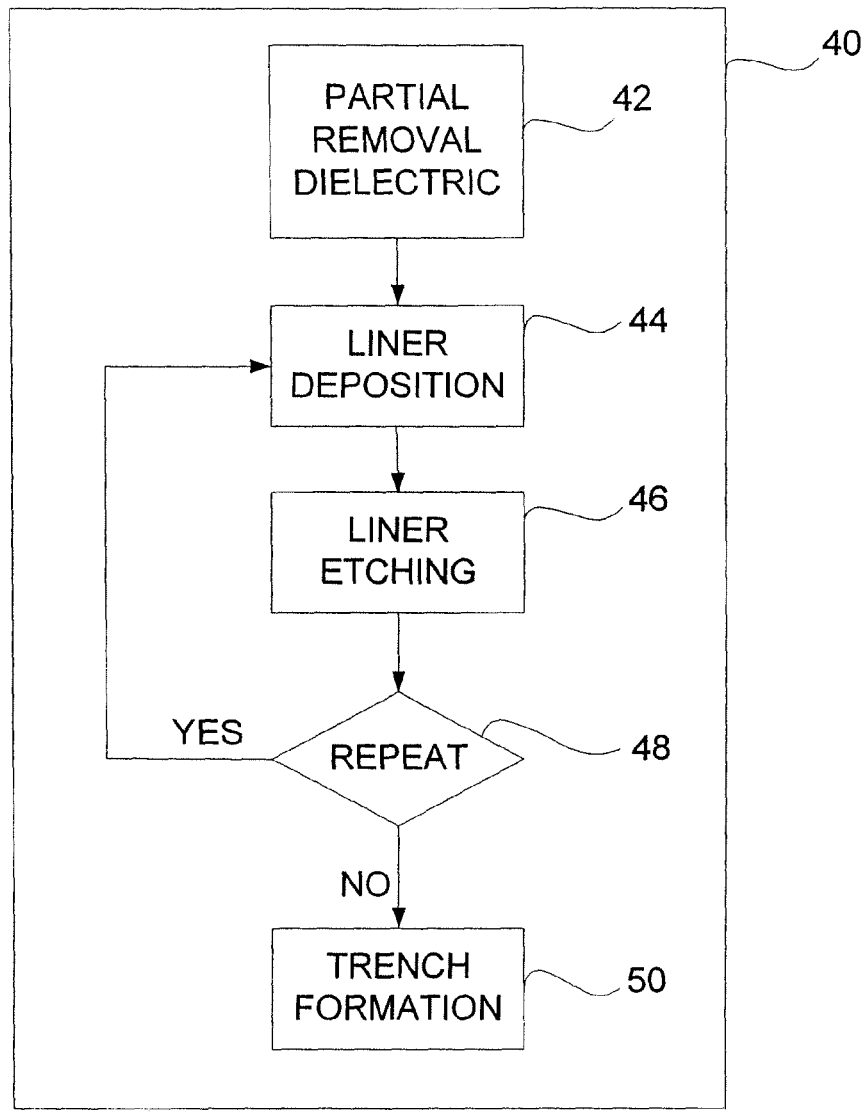
FIG. 10 is a schematic flowchart showing the steps of the method according to embodiments of the present invention.

Referring now to FIG. 10, the method steps for the sequence of integrating self-aligned trenches in-between metal lines is illustrated. A method or process 40 begins with a partial removal of the intertrack dielectric layer, as indicated in a step 42. As described above, this partial etching of the dielectric layer adjusts or controls the height between the conductive metal material and the sacrificial dielectric material in order to control the width of the resulting air cavity trenches that will be formed in the interconnect structure. Then, next, in a step 44, a dielectric liner is deposited using a conformal deposition process (e.g., using PECVD or CVD processes), which is followed by a step 46 of dielectric liner directional etching (e.g., using RIE techniques) where the liner is configured to either serve as a etch-stop layer as well as to guide via landing when forming the vias in the IC substrate. The step 46 further controls the width of the remaining dielectric liner. Thereafter, in a step 48, the liner deposition step 44 and the liner etching step 46 can be repeated, if necessary, and as many times as necessary to achieve a given or suitable width of the dielectric liner that protects the intertrack dielectric. Accordingly, air gap trenches can be subsequently formed via selecting etching of the intertrack dielectric material 26 in a step 50, optimizing air gap formation solutions in this self-alignment process.

Therefore, in the proposed integration method, the width of the trenches can be directly controlled in the dielectric by tuning the height difference between metal and dielectric, as well by the height of deposited dielectric on wafer surface prior to the etch process. As a consequence, this technique optimizes air gap formation process using a self-aligned process that allows as good a coupling capacitance performance (air gap width control, via-misalignment) as using a dielectric liner with an associated lithographic step, which is wholly avoided in this integration scheme. Furthermore, the integration method described herein prevents critical misalignment issues met when a specific air-gap mask is used to locally introduced the air-gaps.

The invention additionally has the advantage of controlling the via etchings with the remaining dielectric liner acting as an etch-stop layer which is critical in affecting the yield in copper interconnects, while at the same time preventing any damage to the transistors of the integrated circuit.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

The invention claimed is:

1. A method of forming a plurality of air cavity trenches in-between metal lines of an integrated circuit, said method comprising the steps of:
    forming a self-aligned barrier on a top surface of a metal line of a semiconductor interconnect structure and on a top surface of another metal line of the semiconductor interconnect structure, each self-aligned barrier forming a cap on its metal line;
    after forming the self-aligned barriers, depositing a dielectric liner on the semiconductor interconnect structure using a conformal deposition process;
    removing part of the dielectric liner on the semiconductor interconnect structure using a directional etching process;
    successively repeating at least once the steps of depositing the dielectric liner and removing part of the dielectric liner so as to achieve a desired width of the remaining dielectric liner on the interconnect structure based on the desired width of the air cavity trench in-between the metal lines; and
    forming at least one air cavity trench in-between the metal line of the semiconductor interconnect structure and the other metal line of the semiconductor interconnect structure by selectively etching an intertrack dielectric layer of the semiconductor interconnect structure using the self-aligned barriers on the top surfaces of the metal lines and the remaining dielectric liner on the interconnect structure as an etching mask, the intertrack dielectric layer being located between the metal lines of the semiconductor interconnect structure,
    wherein when the step of depositing the dielectric liner is first performed, the top surfaces of the metal lines are substantially coplanar with a top surface of the intertrack dielectric layer.

2. The method according to claim 1, wherein the step of depositing the dielectric liner comprises depositing the dielectric liner using chemical vapor deposition or plasma enhanced chemical vapor deposition tools.

3. The method according to claim 1, wherein the step of removing part of the dielectric liner comprises etching the dielectric liner using reactive ion etching techniques.

4. The method according to claim 1, further comprising the step of utilizing the remaining dielectric liner on the interconnect structure as a land pad for via landing on the metal line when forming a via on the metal line.

5. The method according to claim 1, wherein each self-aligned barrier is wider than its metal line.

6. The method according to claim 1, further comprising the step of controlling a level of the dielectric liner deposited on the interconnect structure prior to the step of removing part of the dielectric liner.

7. The method according to claim 1, further comprising utilizing the remaining dielectric liner on the interconnect structure as an etch-stop layer when forming a via in the integrated circuit.

8. The method according to claim 1, wherein the step of forming the self-aligned barrier comprises using an electroless process to deposit the self-aligned barrier.

9. The method according to claim 1, further comprising the step of forming a via, the remaining dielectric liner on the interconnect structure being used as a land pad for landing the via on the metal line when forming the via.

10. The method according to claim 1, further comprising the step of forming a via on the metal line, the remaining dielectric liner on the interconnect structure being used as an etch-stop layer when forming the via on the metal line.

11. The method according to claim 1, further comprising the step of performing an etch for a via on the metal line, the remaining dielectric liner on the interconnect structure being used as an etch-stop layer when performing the etch for the via.

* * * * *